(12) United States Patent
Chen et al.

(10) Patent No.: US 11,270,946 B2
(45) Date of Patent: Mar. 8, 2022

(54) PACKAGE WITH ELECTRICAL INTERCONNECTION BRIDGE

(71) Applicant: STMICROELECTRONICS PTE LTD, Singapore (SG)

(72) Inventors: Yong Chen, Singapore (SG); David Gani, Choa Chu kang (SG)

(73) Assignee: STMICROELECTRONICS PTE LTD, Singapore (SG)

( * ) Notice: Subject to any disclaimer, the term of this patent is extended or adjusted under 35 U.S.C. 154(b) by 27 days.

(21) Appl. No.: 16/987,002

(22) Filed: Aug. 6, 2020

(65) Prior Publication Data
US 2021/0066198 A1    Mar. 4, 2021

Related U.S. Application Data

(60) Provisional application No. 62/894,327, filed on Aug. 30, 2019.

(51) Int. Cl.
*H01L 23/538* (2006.01)
*H01L 25/065* (2006.01)
*H01L 23/00* (2006.01)

(52) U.S. Cl.
CPC ...... *H01L 23/5384* (2013.01); *H01L 23/5385* (2013.01); *H01L 23/5386* (2013.01); *H01L 24/14* (2013.01); *H01L 25/0655* (2013.01)

(58) Field of Classification Search
CPC ............ H01L 23/5384; H01L 23/5386; H01L 23/5385; H01L 23/585; H01L 23/5389; H01L 25/0655; H01L 25/105; H01L 24/14; H01L 24/19; H01L 24/20; H01L 24/24; H01L 24/82; H01L 24/96; H01L 21/56; H01L 21/4825

USPC ............ 257/774, 668, 686, 692, 737, 777, 257/E23.079, E23.069, E23.141, E23.178, 257/E23.179, E21.705, E21.508, E21.505, 257/E21.502, E21.499; 438/107, 108, 438/109, 110, 123
See application file for complete search history.

(56) References Cited

U.S. PATENT DOCUMENTS

| | | |
|---|---|---|
| 6,765,287 B1 | 7/2004 | Lin |
| 9,875,969 B2 | 1/2018 | Braunisch et al. |
| 2003/0064547 A1* | 4/2003 | Akram ................ H01L 25/0652 438/108 |
| 2006/0157866 A1 | 7/2006 | Le et al. |
| 2016/0218082 A1* | 7/2016 | Lee .......................... H01L 24/19 |

(Continued)

OTHER PUBLICATIONS

Alcorn, "Hot Chips 2017: Intel Deeps Dives Into EMTB," published online on Aug. 25, 2017, downloaded from https://www.tomshardware.com/news/intel-emib-interconnect-fpga-chiplet,35316.html on May 24, 20f9, 9 pages.

*Primary Examiner* — Dao H Nguyen
(74) *Attorney, Agent, or Firm* — Seed IP Law Group LLP

(57) ABSTRACT

The present disclosure is directed to a package that includes openings that extend into the package. The openings are filled with a conductive material to electrically couple a first die in the package to a second die in the package. The conductive material that fills the openings forms electrical interconnection bridges between the first die and the second die. The openings in the package may be formed using a laser and a non-doped molding compound, a doped molding compound, or a combination of doped or non-doped molding compounds.

20 Claims, 10 Drawing Sheets

(56) References Cited

U.S. PATENT DOCUMENTS

| | | | |
|---|---|---|---|
| 2017/0365580 A1* | 12/2017 | Shih | H01L 24/14 |
| 2018/0040548 A1* | 2/2018 | Kim | H01L 23/5383 |
| 2018/0240778 A1 | 8/2018 | Liu et al. | |
| 2020/0176384 A1* | 6/2020 | Wu | H01L 23/5381 |
| 2020/0185290 A1* | 6/2020 | Padmanabhan Ramalekshmi Thanu | H01L 21/52 |
| 2020/0357768 A1* | 11/2020 | Shih | H01L 21/6835 |

* cited by examiner

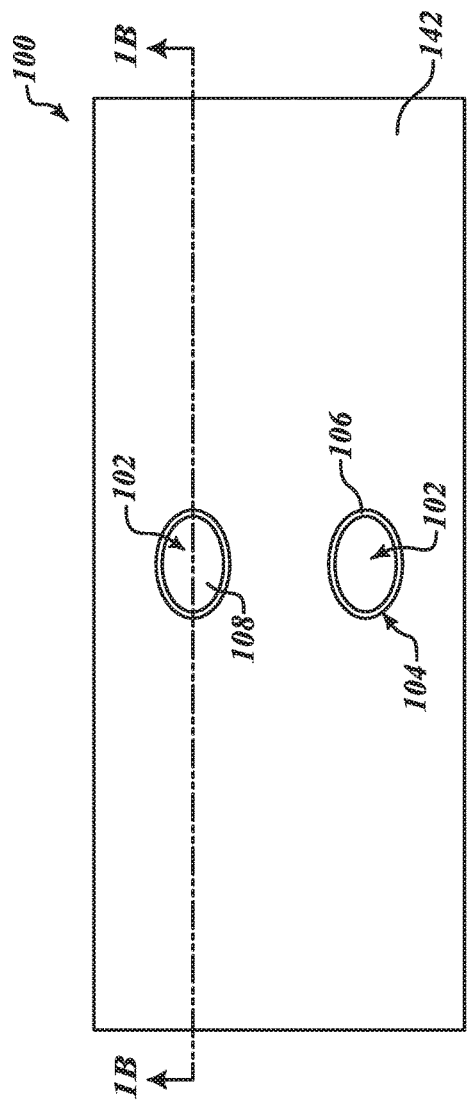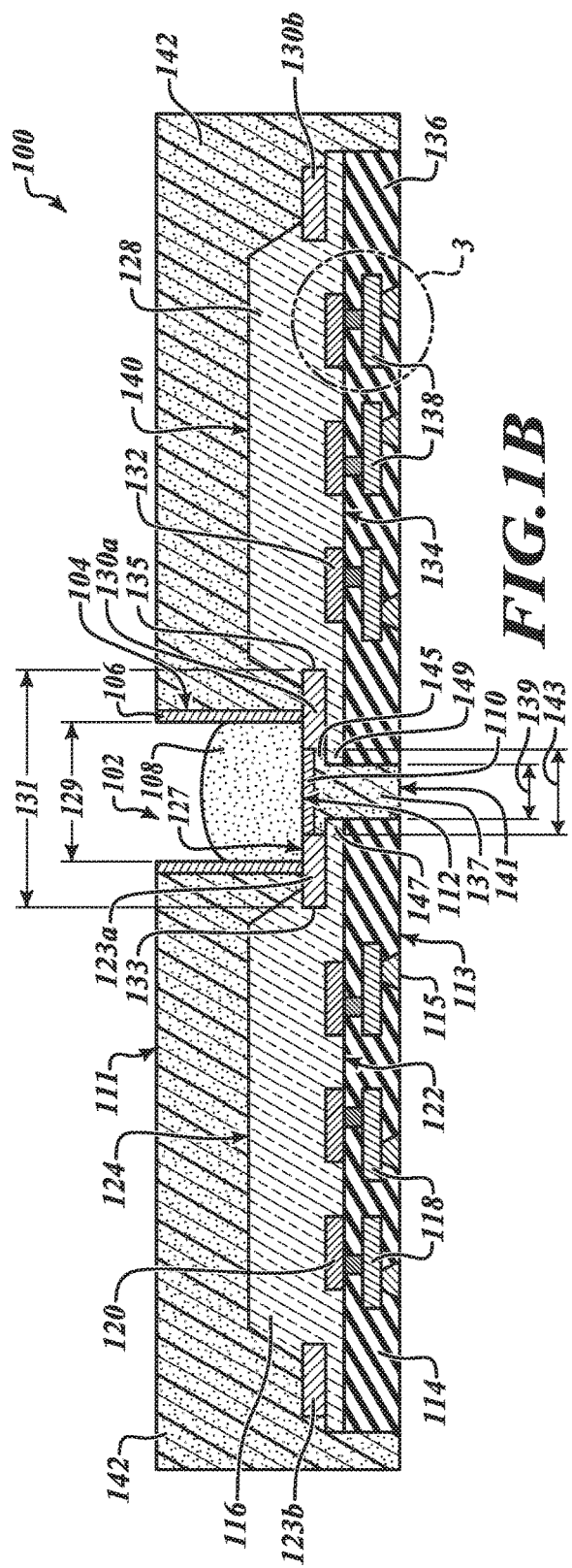

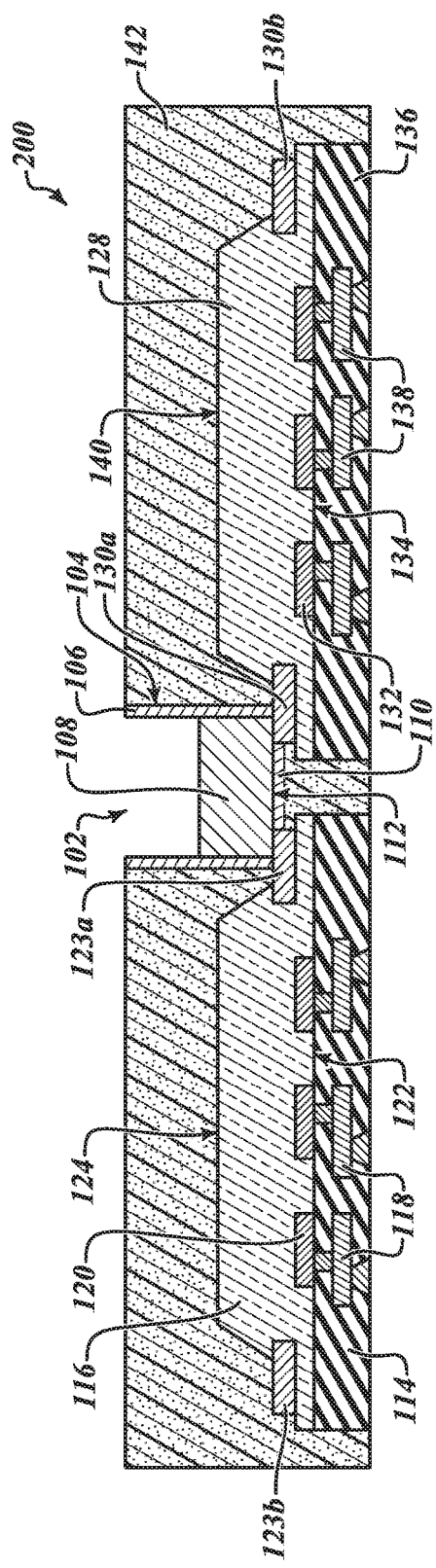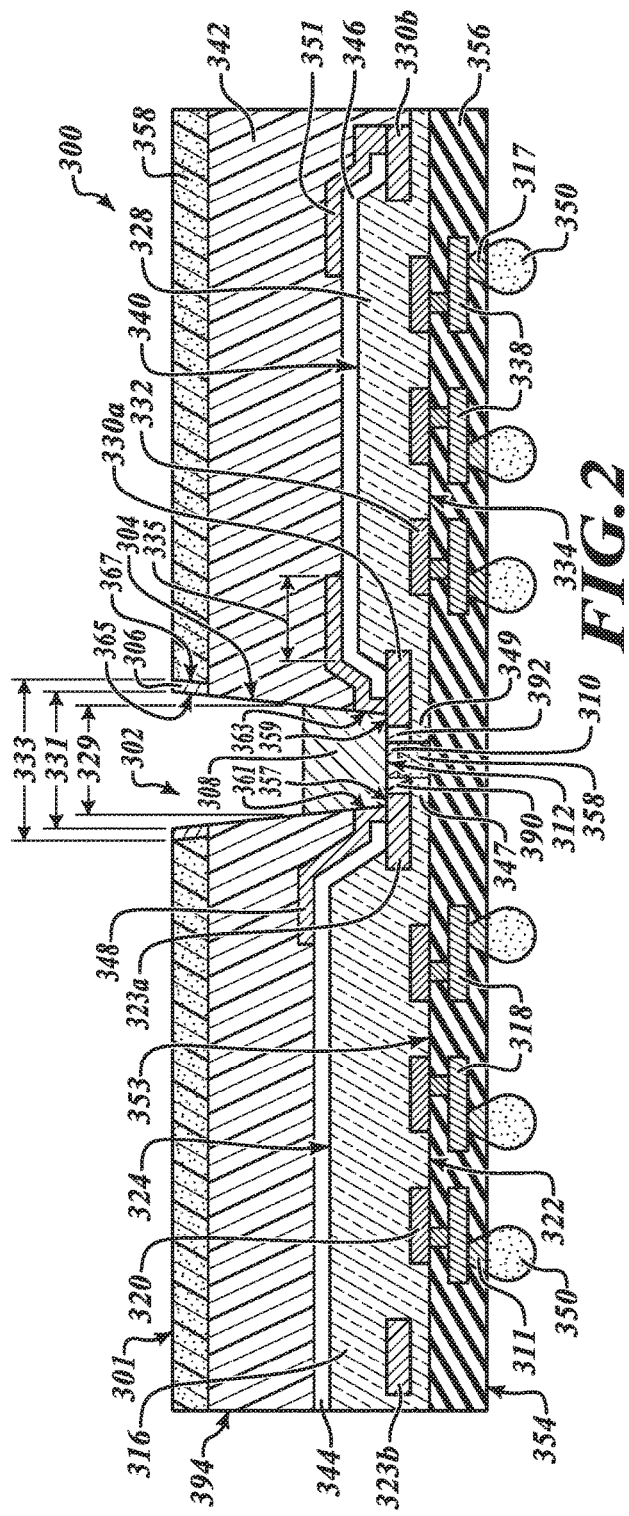

PACKAGE WITH ELECTRICAL INTERCONNECTION BRIDGE

BACKGROUND

Technical Field

The present disclosure is directed to an electrical interconnection bridge to couple multiple die to each other within a package and a method of manufacturing the same.

Description of the Related Art

Generally, semiconductor die in packages are electrically coupled to each other using a printed circuit board (PCB) that is externally coupled to the packages. These packages may include multiple semiconductor die that work together to perform certain functions.

As demand for providing a greater number of semiconductor die in electronic devices to perform ever increasing complex functions while at the same time maintaining a small and thin profile increases, there are significant challenges to reduce the number of packages. Manufacturers are working to reduce a profile of the electronic devices and maintain the capabilities to perform the desired functions, e.g., sensing functions, orientation functions, light sensing functions, camera functions, brightness functions, sound detection functions, and temperature monitoring functions. Examples of electronic devices include a laptop, a display, a television, a computer, a smart phone, a tablet, or any other electronic device.

One significant challenge is producing these electronic devices smaller and thinner while increasing the number of functions the electronic devices can perform. As these functions become more complex or increase in number, the number of semiconductor die to perform these functions increases.

Another significant challenge is providing semiconductor die or packages within a reduced area of the electronic device. For example, as electronic devices become bendable and more articulable in various ways, the area a semiconductor die or package can be mounted within the electronic device is significantly reduced.

BRIEF SUMMARY

In view of these significant challenges above, which is not a complete list, it is desirable to provide packages that can perform more complex functions while taking up less space within an electronic device, reduce the number of electrical connections required to be provided within an electronic device, increase the number of functions that an electronic device can perform, and reduce the profile, e.g., size, thickness, etc., of the electronic device.

The present disclosure is directed to various embodiments of a package that includes electrical interconnection bridges that couple a first die to a second die in the package.

According to one embodiment of a package with electrical interconnection bridges, the package includes openings that expose contacts of the first die and the second die. The openings that expose the contacts of the first die and the second die are filled with a conductive material. The conductive material is positioned within the opening to couple the contacts of the first die to the contacts to the second die. The openings and the conductive material form electrical interconnection bridges between the contacts of the first die and the contacts of the second die. The openings are lined with a thin layer of conductive material that is coupled to the contacts of the first die and the second die.

The thin layer of conductive material may be formed when the openings are formed in the packages. The openings may be formed in a molding compound of the packages that is doped with a conductive material. For example, the openings may be formed in the packages using a laser, such that the doped conductive material in the molding compound melts and coats sidewalls of the openings.

In this embodiment, the conductive material filling the openings is a solder material that is positioned within the openings using a reflow solder technique, a solder drop technique, or some other solder placement technique. However, in other alternative embodiments, the conductive material filling the openings may be a gold material, a copper material, an alloy material, a conductive plating material, or any other conductive material or combinations of conductive materials as desired to fill the openings to couple the first die to the second die.

In an alternative embodiment, the openings of the packages are unlined, which means there is no thin layer of conductive material on the sidewalls of the openings. This occurs when the molding compound is a non-doped molding compound, which means the molding compound is not doped with a conductive material.

BRIEF DESCRIPTION OF THE SEVERAL VIEWS OF THE DRAWINGS

In the drawings, identical reference numbers identify similar elements or acts unless the context indicates otherwise. The sizes and relative portions of the elements in the drawings are not necessarily drawn to scale.

FIG. 1A is a top plan view of an embodiment of a package with openings filled with a conductive material;

FIG. 1B is a cross-sectional view of the embodiment of the package taken along line 1B-1B in FIG. 1A;

FIG. 1C is a cross-sectional view of an alternative embodiment of a package taken along line 1B-1B in FIG. 1A;

FIG. 2 is a cross-sectional view of an alternative embodiment of a package;

DETAILED DESCRIPTION

Figure 3:
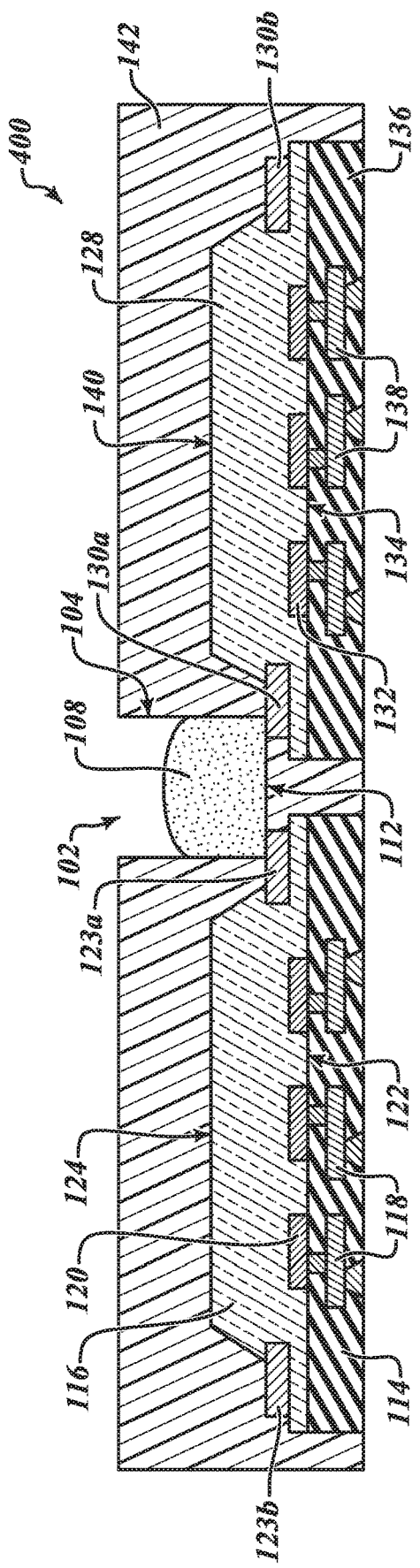
FIG. 3 is a cross-sectional view of an alternative embodiment of a package.

In the following description, certain specific details are set forth in order to provide a thorough understanding of various embodiments of the disclosure. However, one skilled in the art will understand that the disclosure may be practiced without these specific details. In other instances, well-known structures associated with electronic components and semiconductor fabrication techniques have not been described in detail to avoid unnecessarily obscuring the descriptions of the embodiments of the present disclosure.

Unless the context requires otherwise, throughout the specification and claims that follow, the word "comprise" and variations thereof, such as "comprises" and "comprising," are to be construed in an open, inclusive sense, that is, as "including, but not limited to."

The use of ordinals such as first, second and third does not necessarily imply a ranked sense of order, but rather may only distinguish between multiple instances of an act or structure.

Reference throughout this specification to "one embodiment" or "an embodiment" means that a particular feature, structure or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

As used in this specification and the appended claims, the singular forms "a," "an," and "the" include plural referents unless the content clearly dictates otherwise. It should also be noted that the term "or" is generally employed in its sense including "and/or" unless the content clearly dictates otherwise.

The present disclosure is directed to various embodiments of packages that include openings that extend into the packages that expose contact pads of adjacent semiconductor die. The exposed contacts are coupled together by a conductive material filling or partially filling the openings. These embodiments of packages are formed by various methods of manufacturing. The details of these various embodiments of packages and the methods of manufacturing these packages will be discussed in detail as follows.

FIG. 1A is directed to a top plan view of an embodiment of a package 100. The package 100 includes a molding compound 142 and openings 102 that extend into the package 100 through the molding compound 142. The openings 102 have sidewalls 104 that are covered by a thin layer of conductive material 106, which may be a copper material, a gold material, a nickel material, an alloy material, or some other electrically conductive material or combination of electrically conductive materials. The openings 102 are filled with a conductive material 108, which may be a solder material, a copper material, a gold material, an alloy material, a plating material, or some other electrically conductive material or combination of electrically conductive materials.

FIG. 1B is directed to a cross-sectional view taken along line 1B-1B of the package 100 in FIG. 1A. Although the following discussion is with respect to only one of the openings 102, the following discussion applies to both of the openings 102 as shown in FIG. 1A. An array of openings may be included to incorporate more than two die alternative embodiments of packages.

The package 100 includes a first die 116 and a second die 128 coupled together by the conductive material 108 in the opening 102. The sidewall 104 is positioned between the first die and the second die. The sidewall 104 is lined with a conductive material 106. A thin layer of conductive material 110 is at an end 112 of the opening 102.

The package 100 having a first surface 111 that is opposite a second surface 113. The first surface 111 is formed by the molding compound 142. The opening 102 is formed through the first surface 111 and the molding compound 142. The second surface 113 is a surface of a first substrate 114 that is coupled to the first die 116. The first substrate 114 may be a redistribution layer with a plurality of dielectric layers and a plurality of conductive layers. A plurality of electrical connections 118 in the first substrate 114 is presented in a simplistic form. The plurality of electrical connections 118 in the first substrate 114 is coupled to a plurality of contacts 120 of the first die 116. The plurality of electrical connections 118 couple the plurality of contacts 120 to an array of external contacts 115 in the first substrate 114 that allow for coupling of the package to another device or a printed circuit board.

The plurality of contacts 120 are on a first side 122 of the first die 116, and the first side 122 faces toward the first substrate 114. The first die 116 includes a second side 124 that is opposite to the first side 122. The second side 124 is a shaped passive surface. At least one contact 123a is exposed from the second side 124. In other configurations other contacts 123b may be exposed from the second side 124 of the first die 116. The second side 124 faces away from the first substrate 114. Even though the first die 116 and the second die 128 look similar or identical in FIG. 1B, the first die 116 and the second die 128 may be different types of die that perform different functions. The first die 116 and the second die 128 of different types may be formed by similar manufacturing process or different manufacturing processes. In other alternative embodiments, the first die 116 and the second die 128 may look different from one another. In other alternative embodiments, the first die 116 and the second die 128 may have similar functions or may be similar die.

At least a portion of the contact 123a is aligned with the opening 102. A portion of a surface 127 of the contact 123a is exposed by the opening 102, while another portion of the surface 127 of the contact 123a remains covered by molding compound 142.

The contact 123a is coupled to the thin layers of conductive material 106, 110 and the conductive material 108 filling the opening 102. The thin layers of conductive material 106, 110 and the conductive material 108 filling the opening 102 are coupled to at least one contact 130a of the second die 128. The at least one contact 130a is exposed from a second side 140 of the second die 128. The second side 140 is a shaped passive surface. The second side 140 faces away from a second substrate 136 coupled to a first, active side 134 of the second substrate 136. In other configurations, other contacts 130b may be exposed from the second side 140 of the second die 128. The thin layers of conductive material 106, 110 and the conductive material 108 filling the opening 102 form an electrical interconnection bridge coupling the contact 123a of the first die 116 to the contact 130a of the second die 128. The conductive material 108 filling the openings 102 is shown as a solder material in this embodiment. The solder material may be formed and positioned by a reflow solder technique, a solder drop technique, or some other type of solder material formation or placement technique.

A dimension 129 of the opening 102 in a first direction is less than a dimension 131 in the first direction. The dimension 131 is between a first edge 133 of the contact 123a and a first edge 135 of the contact 130a of the second die 128. The dimension 131 includes the contact 123a, the layer of conductive material 110, and the contact 130a.

A portion 137 of molding compound 142 is positioned between the first substrate 114 and the second substrate 136. A dimension 139 in the first direction is less than the dimension 129 of the opening 102. A surface 141 of the portion 137 of the molding compound is coplanar with a surface of the first substrate 114 and a surface of the second substrate 136.

In some embodiments, a dimension 143 of the conductive layer 110 corresponds to an upper portion 145 of the portion 137 of the molding compound 142. The upper portion 145 is wider than a lower portion of the portion 137. A first extension 147 from the first die 116 abuts the portion 137 of the molding compound 142. A second extension 149 of the second die 128 abuts an opposite side of the portion 137 as compared to the first extension 147. The first and second extensions 147, 149 include silicon or semiconductor substrate that remains after exposing the first contact 123a and the second contact 130a. The first contact 123a and the second contact 130a have a thickness in a second direction that is transverse to the first direction. The thicknesses of the first and second contacts 123a, 130a are not necessarily the same. The thicknesses of all of the contacts 123a, 123b, 130a, 130b of the first die 116 and the second die 128 are not necessarily the same. A thickness of the conductive layer 110 is less than the thicknesses of the first and second contacts 123a, 130a, such that the upper portion 145 of the portion 137 of the molding compound 142 is adjacent to the conductive layer 110. An interior surface of both the first extension 147 and the second extension 149 are coplanar with an interior surface of the first substrate 114 and the second substrate 136 that are in contact with the portion 137 of the molding compound 142.

The second die 128 is a different die from the first die 116, made in a different process with different functionally. The first and second die are likely formed from different wafers as will be described in more detail below. The second die 128 includes a plurality of contacts 132 on the first, active side 134 of the second die 128. The plurality of contacts 132 are coupled to a plurality of electrical connections 138 of a substrate 136, such as a redistribution layer that includes a plurality of insulating layers around and between the electrical connections of the plurality of electrical connections 138. The second die 128 includes the contact 130a that is closer to the first side 134 than a second side 140, but is exposed from the second side 140 of the second die 128. The opening 102 is aligned with the contact 130a and overlaps the contact 130a.

The molding compound 142 is on the first die 116, the second die 128, and the substrates 114, 136. In this embodiment, the molding compound 142 is doped with a conductive material. When the opening 102 is formed in the molding compound 142 of the package 100, the thin layers of conductive material 106, 110 are formed, which will be discussed in greater detail below. However, in other alternative embodiments, the molding compound 142 may be a non-doped molding compound. The molding compound 142 may be a plastic material, a non-plastic material, an epoxy material, an insulating material, a non-conductive material, a non-doped material, a doped material, or any other material that may be used to encapsulate a die to form a package.

The opening 102 extends into the molding compound 142. The opening 102 has the end 112 that exposes surfaces of the contacts 123a, 130a. While it is shown the opening 102 has the end 112 flush with the contacts 123a, 130a, in alternative embodiments, the opening 102 may extend into the contacts 123a, 130a, and the opening 102 may extend into the package 100 by any desired distance.

An alternative embodiment of a package is illustrated in FIG. 1C. The alternative embodiments of packages include similar features as discussed above with respect to the embodiment of the package 100 in FIGS. 1A and 1B and reference numbers may be repeated for the sake of simplicity and brevity.

FIG. 1C is directed to an alternative embodiment of a package 200 that includes the same structure as FIG. 1B. The main difference between the package 200 and the package 100 in FIG. 1B is that a different conductive material 108 fills the opening 102 of the package 200. In particular, the conductive material 108 is a conductive plating material, such as a copper material, a gold material, a nickel material, an alloy material, or some other conductive material or combination of conductive materials. The conductive plating material may be formed by an electroless plating technique, an electroplating technique, a chemical deposition technique, or some other deposition or plating technique to form and position the conductive material 108 in the opening 102. The conductive material 108 couples the contact 123a of the first die 116 to the contact 130a of the second die 128.

FIG. 2 is directed to an alternative embodiment of a package 300 that includes a first die 316 and a second die 328. Although FIG. 2 is an alternative embodiment of a package 300, FIG. 2 is a cross-sectional view of the package 300 when taken along a line similar to that of 1B-1B as illustrated in the package 100 embodiment in FIG. 1A. Furthermore, the package 300 has a similar structure to the previous discussed packages 100, 200 in FIGS. 1A-1C.

The first die 316 is a different type of die, formed in a different manufacturing process from the second die 328. The first and second die 316, 328 are on a substrate 356.

The substrate 356 couples a plurality of contact pads 320 on an active surface 322 of the first die 316 to a plurality of external facing contact pads 311 in the substrate 356. The substrate 356 includes a plurality of insulating layers and a plurality of electrical connections or traces 318 that redistribute the contact pads 320 to the external facing contact pads 311, which may be under bump metallizations or other electrical contacts for coupling to another device or printed circuit board. The active surface 322 of the first die 316 is on a surface 353 of the substrate 356. The surface 353 of the substrate 356 faces away from an exposed side 354 of the package 300. The external facing contact pads 311 are on the exposed side 354 of the package 300.

The substrate 356 also couples a plurality of contact pads 332 on an active surface 334 of the second die 328 to a plurality of external facing contact pads 317 in the substrate 356. The substrate 356 includes a plurality of insulating layers and a plurality of electrical connections or traces 338 that redistribute the contact pads 332 to the external facing contact pads 317, which may be under bump metallizations or other electrical contacts for coupling to another device or printed circuit board. The active surface 334 of the second die 328 is on the surface 353 of the substrate 356 that faces away from the exposed side 354 of the package 300.

The pluralities of external facing contact pads 311, 317, the pluralities of contact pads 320, 332, and the pluralities of electrical connections or traces 318, 338 allow for the first die 316 and the second die 328 to receive driving signals, to receive data from external electronics, to supply data to external electronics, or receive or supply any other signal necessary to have the first die 316 and the second die 328 function as desired. For example, the first die 316 may be a processor and the second die 328 may be a sensor that collects and transmit data with respect to pressure, force, light, touch sensitivity, or any other desired quantity. The data and signals may be provided to external electronic devices such as displays, electronic controllers, computers, or any other electronic device as desired. Other such signals could be driving signals to turn the first die 316 and the second die 328 on and off or switch between a low power mode and a high power mode.

Solder balls 350 are coupled to under bump metallizations (UBMs) or external facing contact pads 311, 317 on the exposed side 354 of the substrate 356. However, as shown in the other alternative embodiments of a package in FIGS. 1B and 1C, the external facing contact pads 311 of the substrates may be left exposed and without solder balls coupled to the external facing contact pads 311. The first die 316 and the second die 328 are both coupled to the substrate 356, which is a unitary substrate. The plurality of electrical connections 318 are formed in the substrate and are coupled to a plurality of contacts 320 of the first die 316. The plurality of electrical connections 318 couple the plurality of contacts 320 to the plurality of external facing contact pads 311 that allow for coupling of the package to another device or printed circuit board.

The first die 316 includes a surface 324, which is a substantially passive surface. The surface 324 of the first die 316 faces away from and is opposite to the active surface 322 of the first die 316. The second die 328 includes a surface 340, which is a substantially passive surface. The surface 340 of the second die 328 faces away from and is opposite to the active surface 334 of the second die 328. A dimension of the first die from the surface 353 of the substrate to the passive surface is greater than a dimension of the second die from the surface 353 to the passive surface of the second die.

A passivation layer 344 is on the surface 324 of the first die 316 and a passivation layer 346 is on the surface 340 of the second die 328. The passivation layers 344 and 346 are formed after the passive side of the die are shaped to expose the contacts 323a and 330a, and 330b. The shaping process provides a first portion that exposes the contacts, an angled sidewall portion that extends away from the first portion to the surface 324, 340. Conductive layers 348, 351 are on the passivation layers 144, 146. These conductive layers 348 and 351 are electrically coupled to respective contacts 323a, 330a, and 330b at first ends. Second ends of these conductive layers are on the surface 324, 340. The conductive layers cover the angled sidewall portions of the semiconductor substrates of each die.

The sidewall 304 of the opening 302 that extends into the package 300 is angled, which is unlike the openings 102 in the previous discussed package embodiments in which the sidewall 104 of the openings 102 are vertical or otherwise perpendicular to the substrate. It is noted that all of the sidewalls described in this disclosure are transverse to the substrate surface.

The package 300 includes a first molding compound 342 that is a non-doped molding compound and a second molding compound 358 that is a doped molding compound. The doped molding compound 358 is on the non-doped molding compound 142 and a portion of the doped molding compound 358 is located between contacts 323a, 330a of the first die 316 and the second die 328.

The package 300 includes a first surface 301 that is opposite and faces away from the exposed side 354 of the substrate 356. The first surface 301 is formed by the doped molding compound 358. The opening 302 is formed through the first surface 301. The opening 302 extends through the doped molding compound 358 and the non-doped molding compound 342. The non-doped molding compound 342 is positioned between the die 316, 328 and the doped molding compound 358. The non-doped molding compound 342 covers the passivation layers 344, 346 and the conductive layers 348, 351.

The first die 316 and the second die 328 are coupled together by a conductive material 308 in the opening 302. The sidewall 304 is positioned between the first die 316 and the second die 328. The conductive material 308 contacts surfaces 361, 363 of the conductive layers 348, 351 and surfaces 357, 359 of the contacts 323a, 330a. The conductive material 308 couples the conductive layers 348, 351 and the contacts 323a, 330a to each other. The opening 302 is aligned with the contacts 323a, 330a of the first die 316 and the second die 328. The opening 302 exposes a surface 357 of the contact 323a of the first die, and the opening 302 exposes a surface 359 of the contact 330a of the second die 328. The first die also includes a contact 323b that is positioned closer to an outer surface 394 of the package 300 than the contact 323a. The second die also includes a contact 330b that is positioned closer to the outer surface 394 of the package 300 than the contact 323b. The opening 302 exposes the surface 361 of the conductive layer 348, which is on the passivation layer 344 and is adjacent to the opening 302 and on the passivation layer 344. The opening 302 exposes the surface 363 of the conductive layer 351, which is on the passivation layer 346 and is adjacent to the opening 302. The surfaces 357, 359, 361, 363 of the contacts 323a, 330a, and the conductive layers 348, 351 are coupled to a conductive material 308 that partially fills the opening 302.

The package 300 includes a thin layer of conductive material 306 on the doped molding compound 358. The thin layer of conductive material 306 includes a first surface 365 that is aligned and coplanar with the sidewall 104 of the opening 302. The thin layer of conductive material 306 extends into the doped molding compound 358 and is on the non-doped molding compound 342. The thin layer of conductive material 306 includes a second surface 367 that faces away from the first surface 365 and is covered in the doped molding compound 358.

A first dimension 329 of the conductive material 308 in a first direction is less than a second dimension 331 of the opening 302 in the first direction. The first dimension 329 of the conductive material 308 is a diameter of a widest part of the conductive material 308. The second dimension 331 of the opening 302 is a diameter of a widest part of the opening 302. A third dimension 333 is a diameter of a widest part of the thin layer of conductive material 306. In other words, the third dimension 333 is the diameter that extends out to the second surface 367 of the thin layer of conductive material 306. The first dimension 329 is less than the second dimension 331 and the third dimension 333. The second dimension 331 is less than the third dimension 333. A fourth dimension 335 is a distance that extends over a portion of the surface 340 of the second die 328.

A first extension 347 from the first die 316 abuts a first portion 390 of the non-doped molding compound 342 positioned between the contacts 323a, 330a. A second extension 349 of the second die 328 abuts a second portion 392 that is opposite the first portion 390. The first and second extensions 347, 349 include silicon or semiconductor substrate that remains after exposing the contact 323a of the first die 316 and the contact 330a of the second die 328. The first extension portion 347 is covered by the first portion 390 of the first molding compound 342 and the second extension portion 349 is cover by the second portion 392 of the first molding compound 342. A thin layer of conductive material 310 extends from the first portion 390 to the second portion 392 of the first molding compound 342. A portion of the second molding compound 358 is positioned between the first portion 390 and the second portion 392 of the first molding compound 342 and at an end 312 of the opening 302. The end 312 is positioned between the contact 323a of the first die 316 and the contact 330a of the second die 328.

The first semiconductor die 316 has a surface flush or co-planar with the outer surface 394 of the package 300 and the passivation layer 344 has a surface that is flush or co-planar with an outer surface 394 of the package 300. In this embodiment, the first die 316 did not have material removed to expose the contact 323b. However, in other alternative embodiments, the first die may have material removed to expose the contact 323b before the die is placed within the package 300.

FIG. 3 is directed to an alternative embodiment of a package 400. The package 400 is similar to the packages 100, 200 illustrated in FIGS. 1B and 1C. However, in this alternative embodiment of the package 400, the molding compound 142 is a non-doped molding compound, unlike the doped molding compound 142 in FIGS. 1B and 1C. As a result, the opening is unlined and the conductive material 108 filling the opening electrically couples the contact 123a of the first die 116 to the contact 130a of the second die 128, and the conductive material 108 is an electrical interconnection bridge.

Figure 4B:
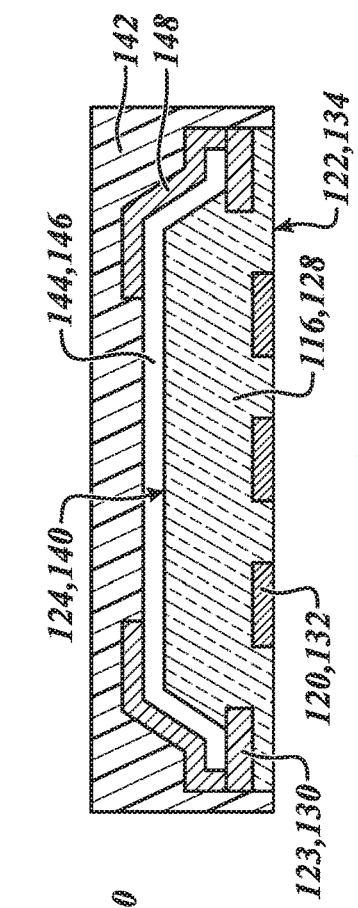
FIG. 4B is a cross-sectional view of an alternative embodiment of a semiconductor die.
Figure 4A:
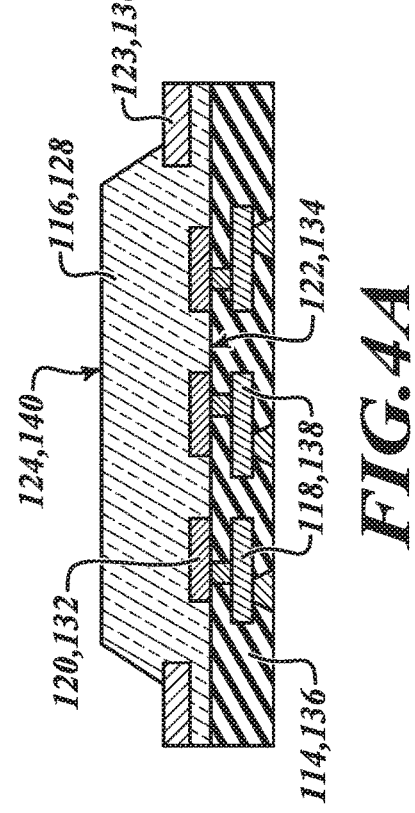
FIG. 4A is a cross-sectional view of an embodiment of a semiconductor die.

FIG. 4A is directed to an embodiment of a semiconductor die 116, 128 that is coupled to a substrate 114, 136. The semiconductor die 116, 128 includes the same features as the first die 116 or the second die 128 as discussed above with respect to FIGS. 1B, 1C, and 3. Although the semiconductor die 116, 128 may look identical to each other, they may be different die that perform different functions and have different cross-sectional areas. The substrate 114, 136 includes the same features as the substrates 114, 136, 356 as discussed above. For example, in one embodiment the semiconductor substrate of the die includes a repassivation layer formed on the semiconductor substrate or wafer surface. The repassivation layer is patterned and etched. A redistribution layer is formed by deposition or growth by plating on top of the repassivation layer. Another repassivation layer is formed on the redistribution layer. An under bump metallization layer is formed on the repassivation layer after patterning and etching of this layer. This semiconductor die 116, 128 that includes the substrate 114, 136 may be incorporated in several various alternative embodiments of the package as disclosed or within the scope of the present disclosure.

FIG. 4B is directed to an alternative embodiment of a semiconductor die 116, 128 with the molding compound 142 on the semiconductor die 116, 128. The molding compound may be a non-doped molding compound or a doped molding compound. The semiconductor die 116, 128 includes the same features as the first die 116 and the second die 128 as discussed above with respect to FIG. 3. A passivation layer 144, 146 is positioned on the semiconductor die 116, 128 and a plurality of conductive layers 148 are on the passivation layer 144, 146 and is coupled to the contacts 123, 130 of the semiconductor die 116, 128. The semiconductor die 116, 128 may be incorporated in several various alternative embodiments of a package as disclosed or within the scope of the present disclosure.

Figure 5:
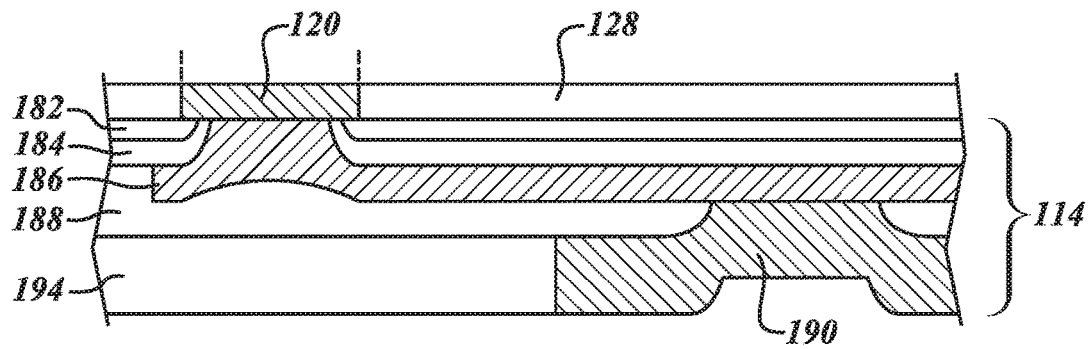
FIG. 5 is a zoomed in, enhanced view of Section 3 in FIG. 1B.

FIG. 5 is a zoomed in, enhanced view of several layers of a portion of the die and the substrate 114 within section 3 in FIG. 1B. The die 128 includes a plurality of contact pads 120 on the first side 134. A passivation layer 182 is on the die 128. The depicted embodiment of the substrate 114 includes at least a first dielectric layer 184, a first conductive layer 186, a second dielectric layer 188, and a second conductive layer 190. The first dielectric layer 184, which may be a passivation layer or a repassivation layer, is positioned between a first conductive layer 186 and the passivation layer 182. The first conductive layer 186 is positioned between a second dielectric layer 188, which may be a passivation layer or a repassivation layer, and the first dielectric layer 184. The first conductive layer 186 is coupled to the contact 120 of the die 128 and a second conductive layer 190 that extends through the second dielectric layer 188. The second conductive layer 190 may be a contact pad, a UBM, an external contact, an exposed contact, a mounting contact, or some other contact or electrical connection. The second conductive layer 190 forms the UBM 311, 317 discussed in FIG. 3. The first dielectric layer 184, the first conductive layer 186, and the second dielectric layer 188 form a redistribution layer (RDL) of the substrate 114. Another optional layer 194 may be placed on the second dielectric layer 188, the optional layer 194 may be a molding compound, a passivation layer, a polymer layer, or any other layer of material as desired. While this discussion directly above is with respect to the substrate 114 in FIG. 1B, the substrates 136, 356 in the various alternative embodiments of a package of the present disclosure may include these features or similar features as well.

Figure 6:
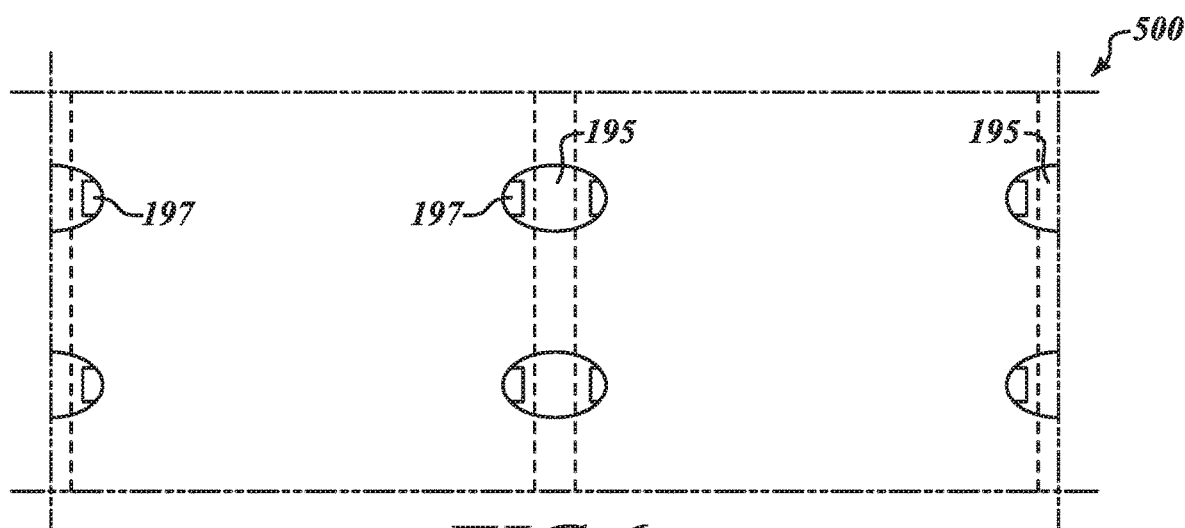
FIG. 6 is a top plan view of an embodiment of an array of semiconductor die during a portion of a manufacturing process.

FIG. 6 is directed to a top plan view of a portion of an array of a semiconductor die 500 on a wafer before the semiconductor die 500 have been singulated into individual die. The semiconductor die 500 includes the same or similar features as discussed above with respect to the other die and semiconductor die. The semiconductor die 500 includes openings 195. The openings 195 are aligned with contact pads 197 and are partially exposing the contact pads 197. These openings may be formed after singulation as well. The dotted lines are representative of cuts made to singulate the array of semiconductor die 500 into individual semiconductor die 500.

Figure 7:
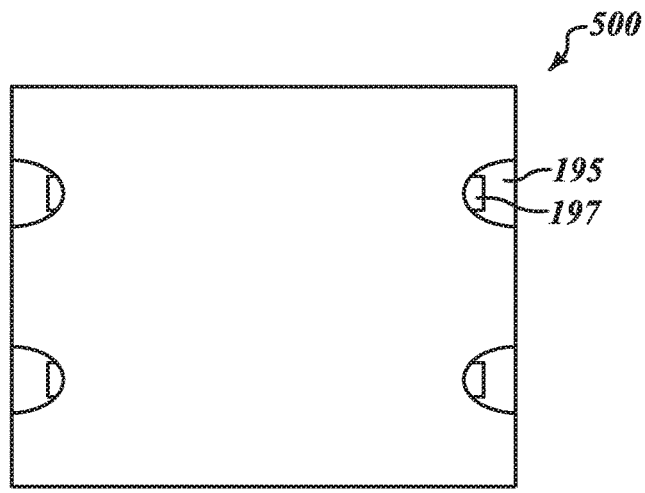
FIG. 7 is a top plan view of an embodiment of a singulated semiconductor die singulated from the array of semiconductor die in FIG. 6.

FIG. 7 is directed to a top plan view of the semiconductor die 500 after the semiconductor die 500 has been singulated. The semiconductor die 500 includes the openings 195. The openings 195 are aligned with the contact pads 197 of the semiconductor die 500. The openings 195 extend toward side surfaces of the semiconductor die 500.

FIGS. 8A-8I are directed to steps of producing an embodiment of a package as discussed and within the scope of the present disclosure.

Figure 8A:
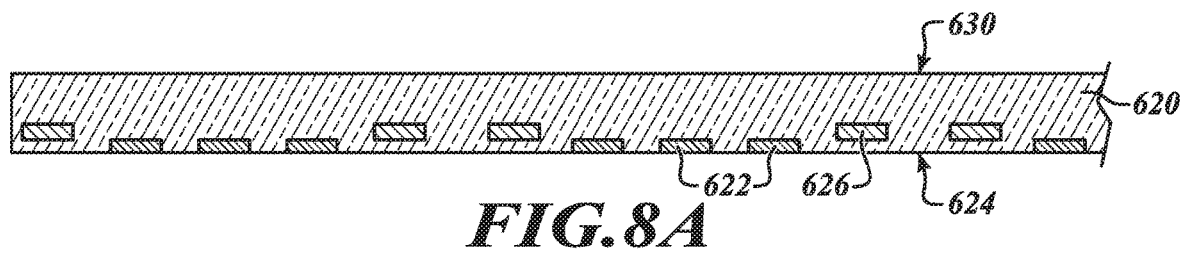
FIGS. 8A-8I illustrate steps of the method for producing the package of FIG. 8I.

FIG. 8A is directed to a wafer 620 that will be processed and singulated into individual semiconductor die. Each die will include a plurality of first contacts 622 that are formed on a first side 624 and a plurality of second contacts 626 that are within the die. The wafer 620 is a semiconductor substrate on which a plurality of layers are formed. The plurality of layers may be a plurality dielectric layers, conductive layers, or a combination of these layers. The conductive layers include vias that pass through the dielectric layers to form electrical connections. The plurality of first contacts 622 and the plurality of second contacts 626 may be positioned within or on the plurality of layers. In one embodiment, the plurality of first contacts 622 are on the semiconductor substrate in a first dielectric layer coupled to a semiconductor substrate of the wafer and a number of dielectric layers are stacked on the first dielectric layer. The plurality of second contacts are in one of the dielectric layers that has an exposed surface for coupling to a PCB or an external electrical device or component. In this one embodiment, the plurality of first contacts 622 are coupled to the plurality of second contacts 624 by a plurality of conductive vias and a plurality of conductive layers. In addition, the first side 624 is an active side of the wafer 620 that is coupled to a variety of circuit elements formed in the semiconductor substrate of the wafer 620, such as transistors, resistors, capacitors, and other electrical components.

The wafer has a second side 630 that is a passive side of the die.

Figure 8B:
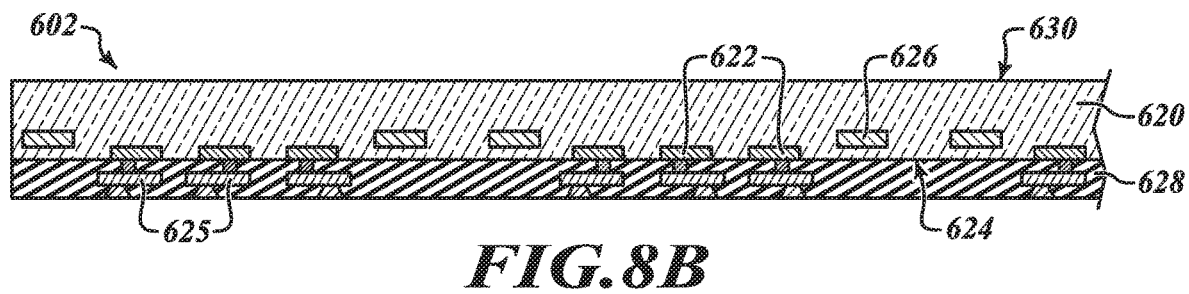

FIG. 8B is directed to step 602 with respect to coupling a substrate 628 to a wafer 620. The plurality of first contacts 622 are coupled to a plurality of electrical connections 625 in the substrate 628. The substrate 628 includes the same or similar features as discussed in FIG. 5. The substrate 628 is formed with a plurality of layers of conductive and dielectric material that are deposited, etched, and coupled together to form the plurality of electrical connections 625. For example, a first passivation layer 182 is formed on the first side 624 of the wafer 620. First openings are formed in the first passivation layer 182 and each respective first opening of the first openings is aligned with a respective contact of the plurality of contacts 622. A first dielectric layer 184 is then formed on the first passivation layer 182 and the plurality of contacts 622. The first dielectric layer 184 fills the first openings. Second openings are then formed by removing portions of the dielectric layer. Each second opening aligns with a respective contact of the plurality of contacts 622. A first conductive layer 186, which may be a metal material such as copper, gold, tin, or another metal or conductive material, is formed on the first dielectric layer and the plurality of contacts 622. The first conductive layer 186 is coupled to the plurality of contacts 622. The first conductive layer 186 and the first dielectric layer 184 are planarized. A second dielectric layer 188 is formed on the planarized first conductive layer and the planarized first dielectric layer 184. Third openings are formed in the second dielectric layer 188 that at least an overlap with the first conducive layers 186 so that a second conductive layer 190 is coupled to the first conductive layer in the third openings. Additional dielectric and conducive layers 194 may be formed until the redistribution is complete and external contact pads are formed. The external contact pads may be under bump metallizations or some other type of external electrical contact or connection. The external contact pads are part of the plurality of electrical connections.

The first openings, the second openings, and the fourth openings may be formed using an etching technique, a grinding technique, or some other removal technique. The etching techniques may be a photoresist etching, a chemical etching, or some other type of etching technique.

Figure 8C:
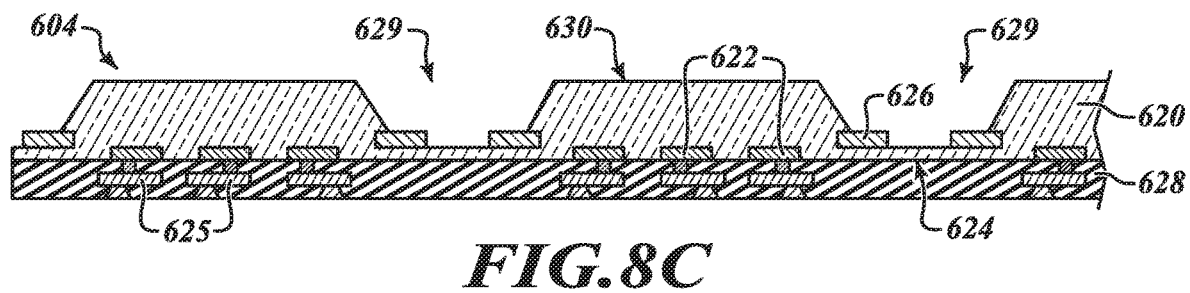

FIG. 8C is directed to step 604 with respect to etching the wafer 620. The wafer 620 is etched from the passive side 630 that is facing away from the substrate 628. Openings 629 are formed between adjacent die in the wafer 620 and exposes contacts 626. The etching of the passive side 630, forming the openings 629, exposes the plurality of second contacts 626 of the wafer 620. This etching step may be completed by utilizing a chemical etching, a mechanical etching, a photoresist etching, or any other etching technique to remove material from the wafer 620 to expose the plurality of second contacts 626 within the wafer 620. These second contacts 626 are coupled to the active and passive circuitry that is formed in the substrate, such as contact pads that might transmit data between a sensor and a processor or ASIC associated with the sensor. These internal contacts allow the overall foot print of the resulting die to be smaller as the connection to the other die does not need to be on the surface with the contacts 622 and instead is coupled internally within the resulting package.

Figure 8D:
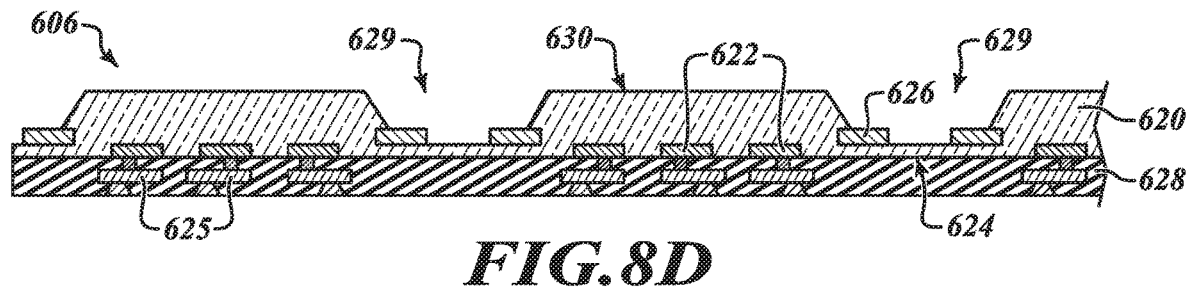

FIG. 8D is directed to step 606 with respect to grinding the wafer 620. This grinding step 606 is an optional step that is completed before the wafer is etched. In this grinding step 606, the wafer is ground down on the passive side 630 to reduce a thickness of the wafer 620. The etching step as discussed in step 604 is then completed after the grinding step 606. This reduction in thickness before etching step 604 will reduce the thickness of the completed packages with the electrical interconnection bridges. The thickness will be reduced because the electrical interconnection bridges are supplied on the passive side 630 of the die 632 instead of forming connections between the die 632 on the active side of the die. By forming the electrical interconnection bridges between the two die 632 on the passive side 630, the package 636 will only have to accommodate the thickness of the two die 632 because the electrical interconnection bridges have a thickness that is less than the thickness of the two die 632 or less than the thickness of the combined thickness of one die 632 and the molding compound 638.

Figure 8E:
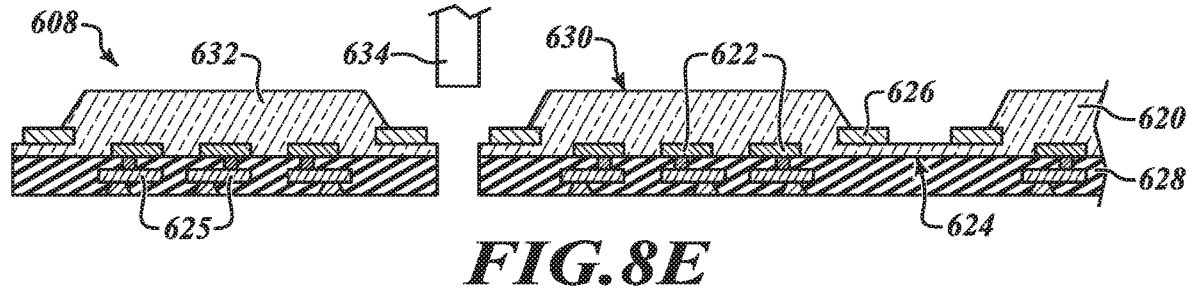

FIG. 8E is directed to step 608 with respect to singulating the wafer 620 into individual semiconductor die 632. In this singulation step 608, the semiconductor die 632 are singulated using a cutting device 634. The cutting device 634 may be a saw, a laser, a blade, or some other cutting device. The semiconductor die may also be singulated using another etching step. This another etching step may be a chemical etch, a photoresist etch, or some other type of etching technique. The respective contacts 626 exposed on the passive side 630 of the wafer 620. The cut may leave extensions of the wafer that extend past an edge of the contact 626 as shown in FIG. 8E. In other alternative embodiments, the cut may be made flush with an edge of the contacts 626 such that there are no extensions that extend past an edge of the contact 626.

Figure 8F:
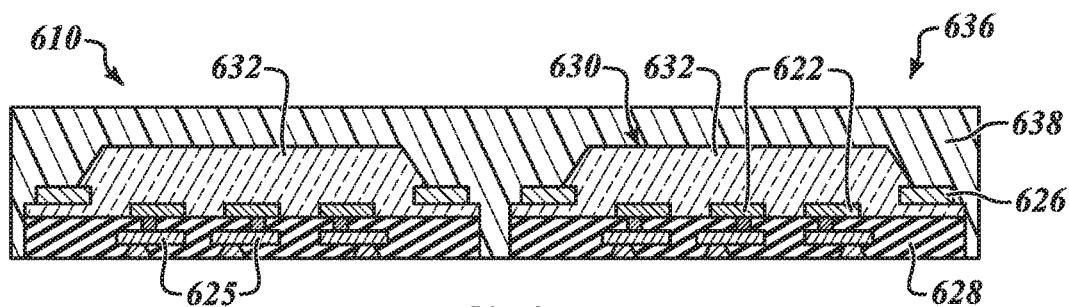

FIG. 8F is directed to step 610 with respect to forming a package 636 including a molding compound 638 and two semiconductor die 632. In this formation step 610, the molding compound 638 is formed to encase two semiconductor die 632 in a package 636. The first and second die may be formed from the same wafer, but are more likely to be formed by two different processes and coupled together in a single package so that the two die work together to solve a technical problem or perform more complex functions as desired. The molding compound 638 may be a doped molding compound or a non-doped molding compound. If the molding compound 638 is doped, the molding compound 638 is doped with a conductive material such as a copper material, a gold material, a nickel material, an alloy material, or another conductive material or combination of conductive materials.

Figure 8G:
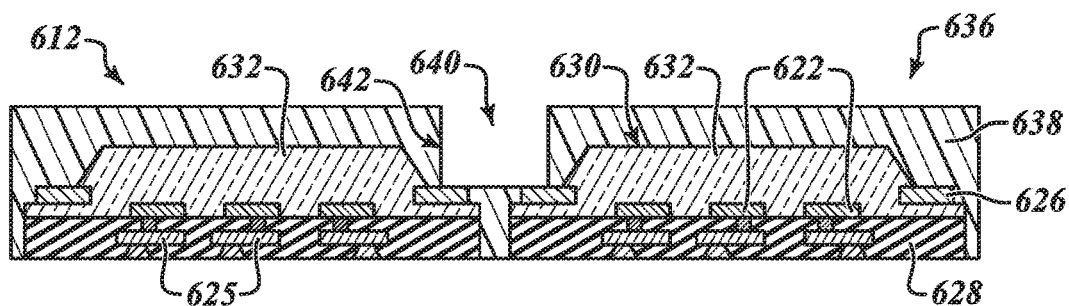

FIG. 8G is directed to step 612 with respect to laser drilling the package 636. In this laser drilling step 612, a laser is directed at the package 636 to remove material from the package 636 to form an opening 640. The laser drilling melts away, burns away, or removes molding compound 638 that is between contacts 626 that were previously exposed on the passive side 630 of the wafer 620 by the etching step 604. The laser drilling forms the opening 640. The laser drilling forms a portion of the molding compound 638 positioned between the two die 632 and that has a surface that is coplanar with surfaces of the contacts 626 that are exposed by the laser drilling. In this embodiment, the molding compound is a non-doped molding compound. As the molding compound 638 is removed from the package 636, a sidewall 642 of the opening 640 is formed that is aligned with contacts 626 that are on the passive side 630 of the die, the sidewalls are aligned with the surface of the contacts 626. The molding compound 638 still covers a portion of the surface of the contacts 626.

However, when the molding compound is doped with a conductive material, a thin layer of conductive material will be formed on the sidewall 642 of the opening 640, which can be seen in FIGS. 1A and 1B, as discussed above. The thin layer of conductive material formed on the sidewall 642 couples the contacts 626 exposed by the laser drilling to each other. It also allows for a plating material to be placed within the opening to couple the contacts 626 that are exposed on the passive side 630 of the die 632 when a plating material is used to couple the two die 632 together. The layers of conductive material that are formed on the sidewall 642 when the molding compound 638 is doped with a conductive material are known as laser direct structuring. A layer of conductive material is also formed on the surface coplanar with the surface of the contacts of the portion of the molding compound between the two die 632.

The sidewall 642 in this embodiment is shown as being vertical, however, in other alternative embodiments, the sidewall may have an angled surface as disclosed and discussed in FIG. 3 above.

In other alternative embodiments, the laser drilling that forms the openings 640 may drill partially into the contacts 626 that are exposed. This results in the contacts 626 of the two die 632 that are exposed having a first portion with a first height that is aligned with the opening 640 and a second portion with a second height that is covered in the molding compound 638. The contacts 626 exposed on the passive side 630 of the two die 632 are L-shaped.

Figure 8H:
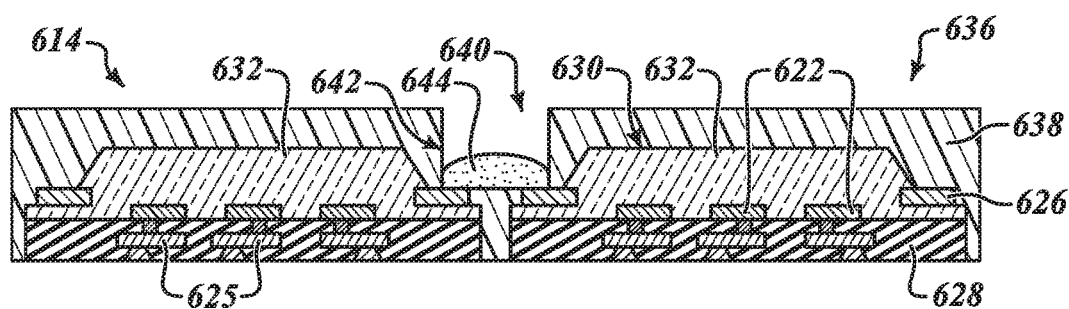

FIG. 8H is directed to step 614 with respect to forming a conductive material 644 in the opening 640 to couple the second contacts 626 of the two semiconductor die 632 to each other. In this embodiment, the conductive material 644 is a solder material. This couples the semiconductor die 632 to each other and the conductive material 644 forms an electrical interconnection bridge between the two semiconductor die 632. In this embodiment, the conductive material 644 is a solder material. The solder material 644 is positioned within the opening 640 using a solder reflow technique, a solder ball drop technique, or some other technique for placing a solder material. However, in other alternative embodiments, the conductive material may be a gold material, a copper material, a nickel material, an alloy material, or some other conductive material or combination of conductive materials. The techniques for placing these alternative conductive materials may be a chemical deposition technique, an electroless plating technique, or some other plating technique or conductive material placement technique.

The solder material 644 placed in the openings 640 forms electrical interconnection bridges that couples the two die 632 together. The solder material covers the exposed surfaces of the contacts 626 that are aligned with the opening 640. The solder material 644 also covers the surface coplanar with the contacts 626 exposed of the two die 632 that is a part of the portion of the molding that is positioned between the two die 632. Again, by utilizing the solder material 644 to fill the opening 640 and to couple the exposed contacts 626, the height of the package is unaffected because the solder material 644 does has a height that is less than the molding compound, while still forming the electrical interconnection bridges between the two die 632.

Alternatively, when the molding compound 638 is doped with the conductive material, the sidewall and the surface coplanar with the exposed contacts 626 of the portion of the molding compound positioned between the two die 632 are covered in the conductive material. This layer of conductive material allows for a more robust electrical interconnection bridge to be formed between the exposed contacts 626 of the two die 632. Also, when a plating material is used instead of a conductive material, the plating material forms a more robust electrical interconnection bridge between the exposed contacts 626 of the two die 632 because a greater amount of plating material will adhere to the conductive layers and exposed contacts in the opening 640. When the conductive plating material is used, the conductive plating material may be placed by electroless plating, chemical deposition, or some other conductive plating technique.

Figure 8I:
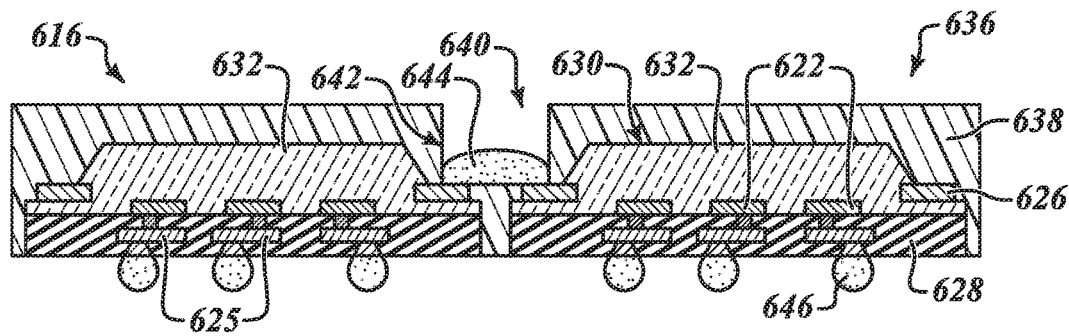

FIG. 8I is directed to step 616 with respect to forming a plurality of solder balls 646 on the package 636. The solder balls are connected to the plurality of electrical connections 625 of the substrate 628. After the plurality of solder balls 646 are coupled to the package 636, the package 636 is completed. In another alternative embodiment, the solder balls 646 may not be coupled to package 636 before shipment and the completed semiconductors package 715 may not include solder balls 646.

FIGS. 9A-9L are directed to an alternative method 800 of forming various embodiments of packages described in the present disclosure.

Figure 9A:
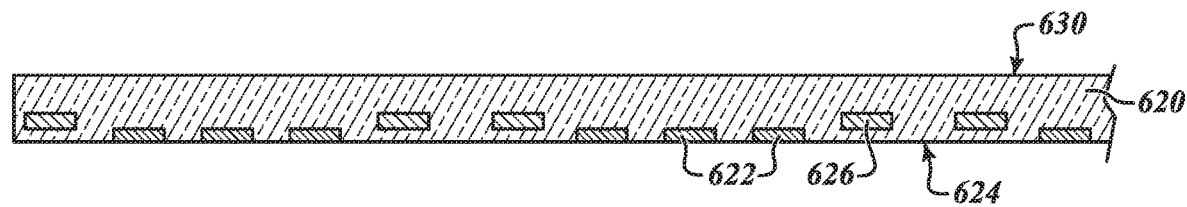
FIGS. 9A-9L illustrate steps of the alternative embodiment of the method for producing the package of FIG. 9L.

FIG. 9A is directed to a wafer that includes external contact 622 and internal contacts 626. The internal contacts 626 are exposed by the openings 629. The wafer further includes an active side 624 that has the external contacts 622 on the active side 624, and a passive side 630 that is opposite the active side.

Figure 9B:
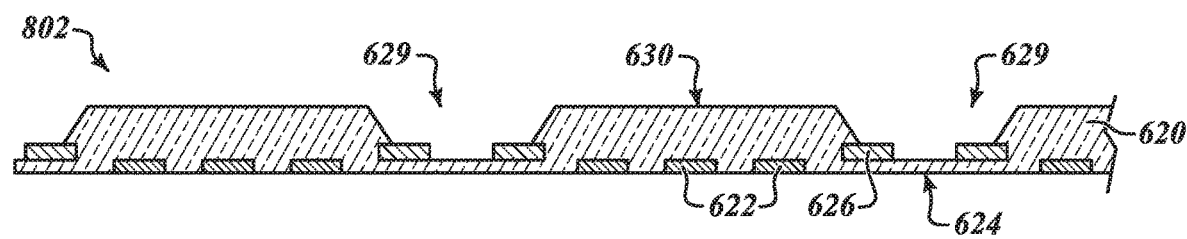

FIG. 9B is directed to step 802 is directed to an etching step 802 of the wafer 620. In this etching step 802, openings 629 are formed between contacts 626 on a second side 630 of the wafer 620. The second side 630 is a passive side 630. The openings 629 expose the contacts 626. A first portion of the contact 626 extends into the wafer 620 and a second portion of the contact is exposed by the openings 629. Before this etching step, a grinding step may be down to the passive side 630 of the wafer 620 to reduce the height of the wafer 620. In turn, this reduction in height in the wafer 620 will result in the individual, singulated die having a smaller height and will result in completed packages having a smaller height as well.

Figure 9C:
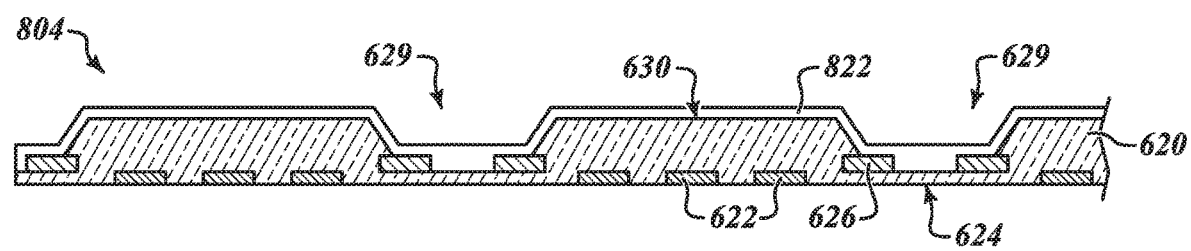
Figure 9D:
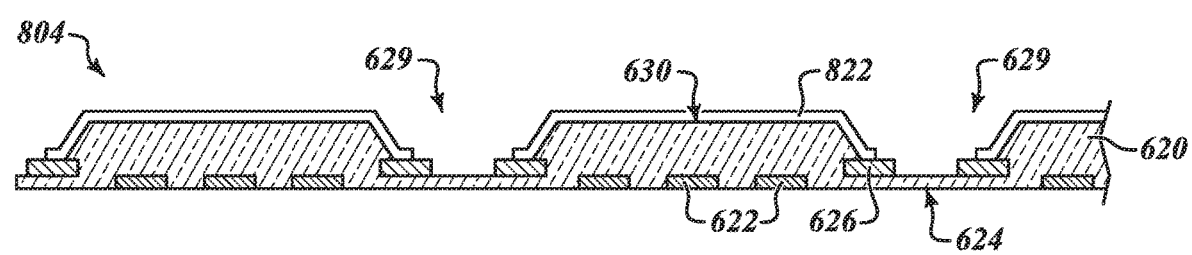

Step 804 is directed to forming a passivation layer 822 on a wafer 620 that has been etched. The wafer 620 was etched in the etching step 802. The formation of the passivation layer 822 is shown in FIGS. 9C and 9D. In the first step in FIG. 9C, the passivation layer is deposited onto the etched wafer 620. The passivation layer 822 covers the passive side 630 of the etched wafer 620, the exposed contacts 626, and fills a space in the openings 629 between the contacts 626. The passivation layer 822 may be deposited using an electroless deposition technique, an electroplating deposition technique, a chemical deposition technique, a photoresist deposition technique, a spray on deposition technique, or any other deposition technique. In the second step in FIG. 9D, portions of the passivation layer 822 are removed. The portions of the passivation layer 822 that are removed are portions that are in the space of the openings 629 between the contacts 626 and portions that cover the contacts 626. However, the passivation layer 822 may still cover part a surface of the contacts 626. However, in other alternative embodiments, the passivation layer 822 may be completely removed from the surface of the contacts 626. The portions of the passivation layer 822 may be removed utilizing an etching technique, a laser removal technique, a mechanical removal technique, a photoresist removal technique, a cutting technique, or any other removal technique.

Figure 9E:
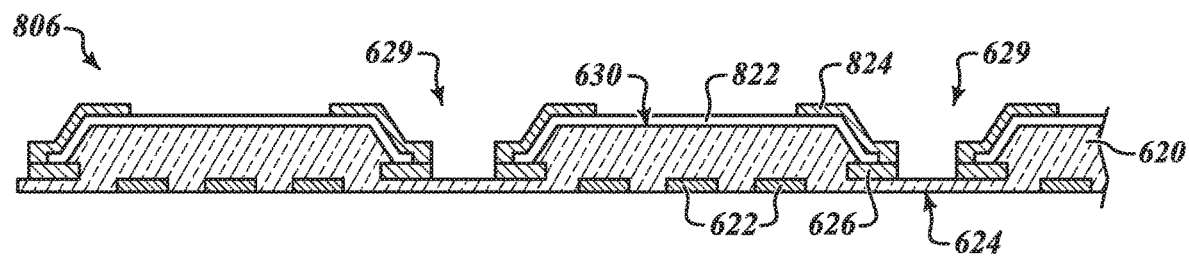

Step 806 is directed to a forming a conductive layer 824 on the etched wafer 620. The conductive layer 824 may be a layer of metal material. The conductive layer 824 is formed on the passivation layer 822, which is shown in FIG. 9E. The conductive layer 824 is coupled to a contact 626 of the etched wafer 620. The conductive layer 824 is deposited onto the passivation layer 822 and in the space between the contacts 626, similar to how the passivation layer is deposited onto the passive side 630 of the wafer 620 in step 804. Portions of the conductive layer 824 in the openings 629 between the contacts 626 are removed and portions of the conductive layer 824 are removed from the passivation layer 822. By removing these portions of the conductive layer 824, the conductive layer 824 is coupled to and covers a portion of the exposed surface of the contacts 626. The conductive layer 824 may be deposited utilizing a chemical deposition technique, an electroless plating technique, a photoresist technique, or some other deposition technique or combination of deposition techniques. The portions of the conductive layer 824 may be removed by a laser etch, a chemical etch, a photoresist etch, or some other type of etching or combination of etchings.

Figure 9F:
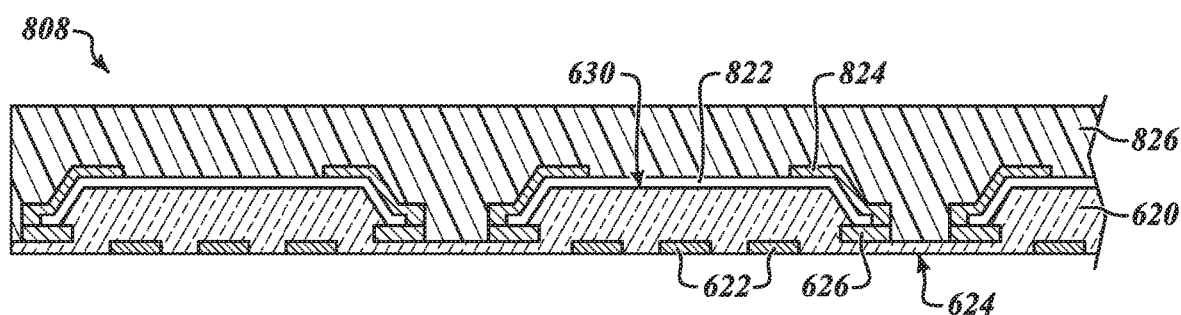
Figure 9G:
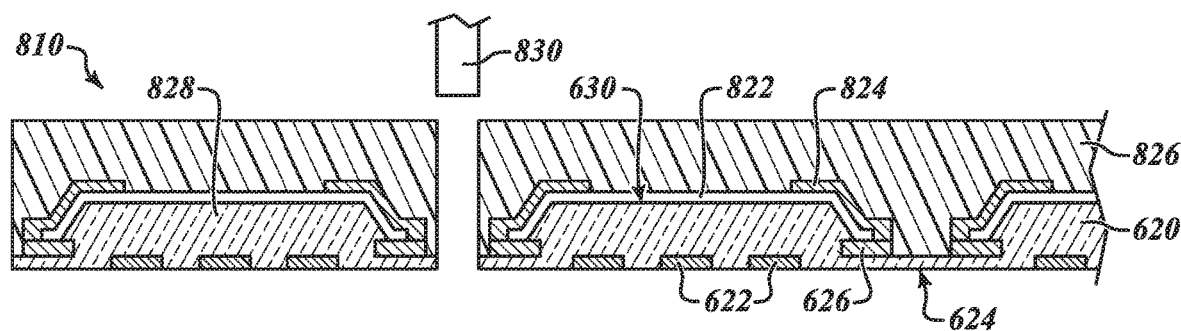

Step 808 is directed to forming a first molding compound 826 on the etched wafer 620 with the conductive layer 824 and the passivation layer 822, which can be seen in FIG. 9F. The first molding compound 826 is a non-doped molding compound. In formation of the first molding compound 826 step, the molding compound is placed to cover the conductive layer 824, cover the passivation layer 822, and fill the openings 629 with the molding compound 826.

Step 810 is directed to a singulation step. Similar to step 608 in FIG. 8E, the molding compound 826, the wafer 620, the passivation layers 822, and the conductive layers 824 on the passivation layers 822 are singulated into individual die by a cutting device 830. The cutting device 830 cuts through portions of the molding compound 826 and the wafer 620 that are aligned with the openings 629. In this instance, the die 828 has a portion that extends beyond an edge of the contacts 626 and is coplanar with an outer surface of the molding compound 826 after singulation. However, in other alternative embodiments, the edge of the contact 626 and the die 828 may be flush with the outer surface of the molding compound 826, and there may be no portion of the die 828 that extends beyond the edge of the contacts 626. The cutting device 830 may be a saw, a laser, or some other device to cut or singulate die from a wafer. This can be seen in FIG. 9G. Also, as discussed above, in an alternative embodiment of singulating the wafer 620, the passivation layers 822, the conductive layers 824 and the molding compound 826 into individual semiconductor die, the cut can be made wider than shown in FIG. 9G such that the conductive layer 824 and the contact 626 are exposed on an outer edge and flush with the molding compound 826 on the outer edge.

Figure 9H:
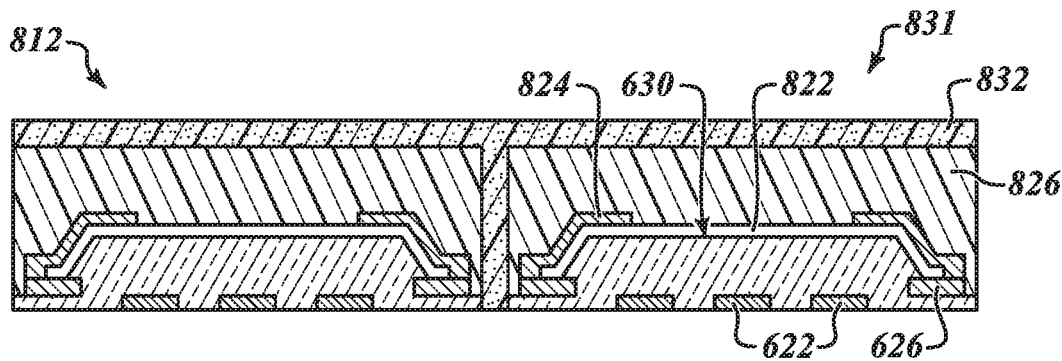

Step 812 is directed to forming a second molding compound 832 to physically couple two semiconductor die 828, which can be seen in FIG. 9H. The second molding compound 832 is a doped molding compound. The doped molding compound 832 is doped with a conductive material such as a copper material, a gold material, a nickel material, an alloy material, or some other conductive material or combination of conductive materials. Although the two semiconductor die 828 appear to be the same in FIG. 9H, the two die 828 may be similar die formed by a similar manufacturing process, the two die 828 may be different die formed by different manufacturing processes, and the two die may have different functions or structures. The doped molding compound 832 couples two die 828 together as shown in FIG. 9H. However, in other alternative embodiments, the doped molding compound 832 may couple any number of die 828 as desired to form a package that is capable of performing ever more complex functions. The doped molding compound may be formed by compression molding, transfer molding, or some other molding technique for coupling two die 828 together to form a package 831. The second, doped molding compound 832 is coupled to the outer surfaces of the first molding compound 826. The second molding compound may be coupled directly to the two die 828, the conductive layer 824, and the contacts 626 when the conductive layer 824 and the contacts 626 have surfaces that are flush with the outer surface of the non-doped molding compound 826.

Figure 9I:
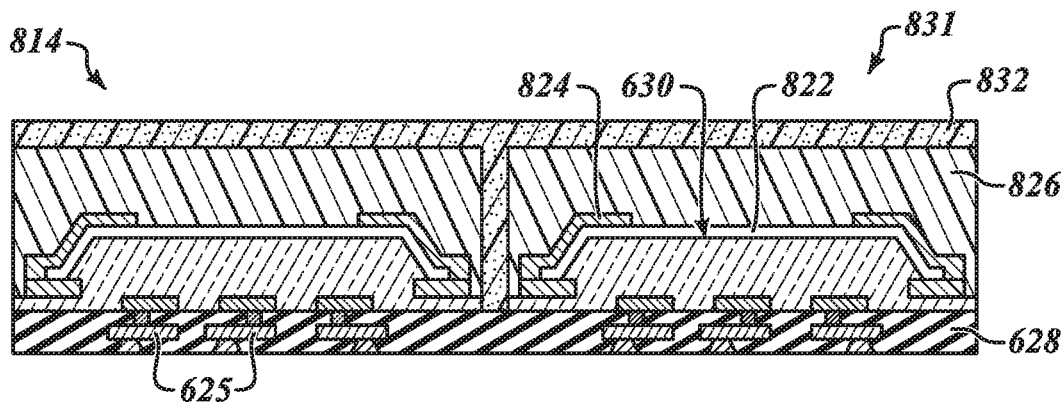

Step 814 is directed to coupling the substrate 628 to the two semiconductor die 828, which can be seen in FIG. 9I. This process is similar to the discussion above with respect to FIG. 8B as to step 602 in which the substrate 628 is coupled to the wafer 620. However, in this instance, the various layers, which may be dielectric layers, passivation layers, and conductive layers, of the substrate 628 are coupled to the two die 828 that are coupled together by the doped molding compound 832.

Figure 9J:
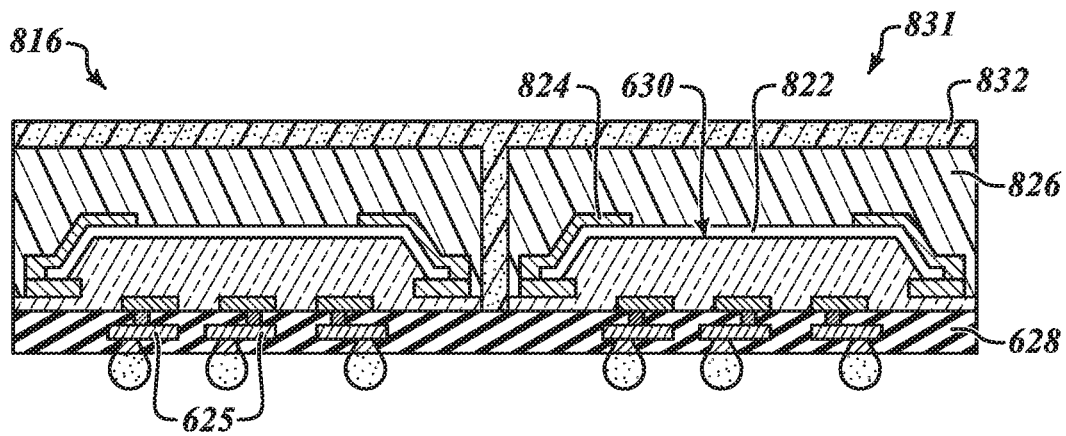
Figure 9K:
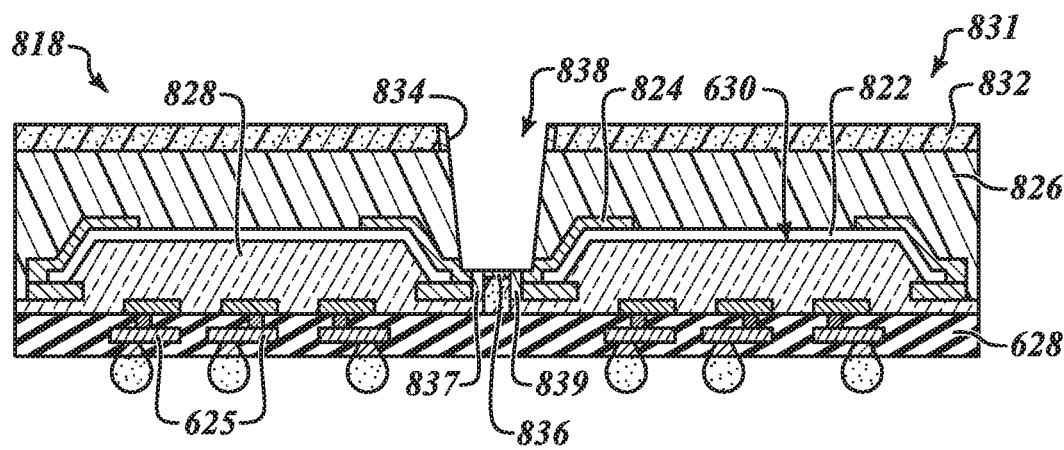
Figure 9L:
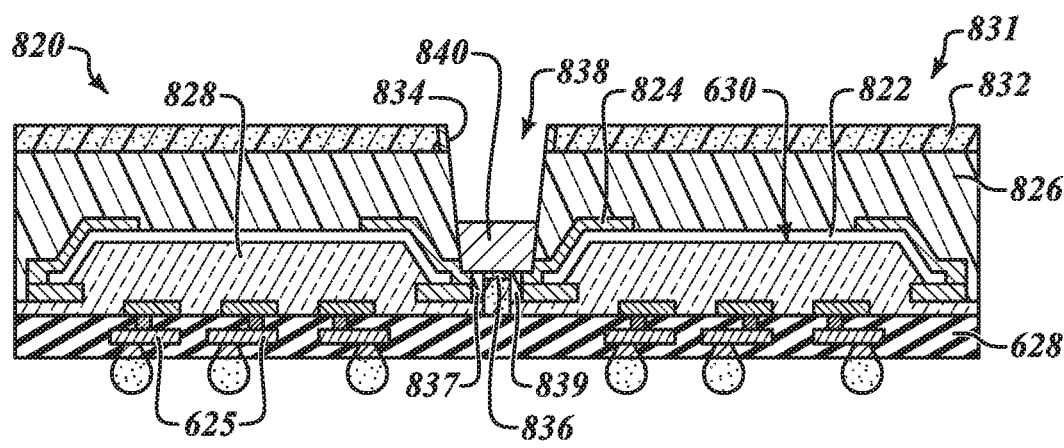

Step 816 is directed to coupling a plurality of solder balls 646 to the substrate 628, which can be seen in FIG. 9J. The solder balls may be coupled to the substrate through a solder reflow technique, a solder ball placement technique, or some other solder ball formation technique. The solder balls are coupled to under bump metallization of the electrical contacts 625 that are in the substrate 628.

Step 818 is directed to laser direct structuring a package 831. This laser direct structuring step 818 has a result that is similar to the packages illustrated in FIGS. 1A and 1B above. In this laser direct structuring step 816, when the second molding compound 832 is removed to form an opening 838, thin layers of conductive material 834, 836 are left behind. One thin layer of conductive material 834 is positioned at a first end of the opening 838, and another thin layer of conductive material 836 is positioned at a second end of the opening 838 adjacent to the two semiconductor die 828. The difference between this laser direct structuring step and the laser drilling step 612 discussed above is that instead of having a non-doped molding compound when laser drilling 612, the molding compound 832 is a doped with a conductive material. When this doped molding compound 832 is removed, melted away, or burned away using a laser, thin layers of conductive material are formed that line the opening 838 formed in the package 831, similar to the result that can be seen in FIGS. 1A and 1B. By removing the molding compound 832 using a laser, a conductive structure is formed that will be in a completed package 831 because as the doped molding compound 832 is removed by the laser, the conductive material 834, 836 is left behind, however, the rest of the doped molding compound 832 that is not the dopant is burnt or melted away.

The laser removes portions of the first molding compound 826, the second molding compound 832, and the conductive layers 824, and surfaces of the conductive layers are flush with the second end of the opening 838. The laser forms the opening 838 that is positioned between the two die 828 and is aligned with a portion of the first molding compound 837, a portion of the second molding compound 832, and the another thin layer of conductive material 836, which is on the portion of the second molding compound 832. In other alternative embodiments, the laser may cut into the first molding compound 826, the second molding compound 832, the conductive layer 824, and the contacts 626. In these other alternative embodiments, a surface of the contacts 626 may be flush with the second end of the opening 838.

Step 820 is directed to electroless plating of the package 831. The electroless plating step 820 can be seen in FIG. 9L. The conductive material 840 couples to the exposed conductive layers 824 and the thin layer of conductive material 836 that is positioned at a second end of the opening 838. A first portion 837 of the non-doped molding compound 826 is positioned between the doped molding compound aligned with the conductive material 840 filling the opening 838 and the conductive layer 824 on one of the die 828. A second portion 839 of the non-doped molding compound 826 is positioned between the doped molding compound aligned with the conductive material 840 filling the opening 838 and the conductive layer 824 on the other of the die 828. In other words, the thin layer of conductive material 836 and exposed surfaces of the conductive layers 824 are covered in the conductive material 840 and are coupled together by the conductive material 840. The conductive material 840 couples the two die in the package 831 to each other.

The benefits of the above various packages will now be discussed. For the sake of simplicity and brevity, the benefits will be discussed with respect to the embodiment in FIG. 1B. However, these benefits apply to each and every package embodiment within the above present disclosure and within the scope of the above present disclosure.

A benefit of a package 100 including an electrical interconnection bridge formed by the conductive material 108 that fills the opening 102 in the package 100 is that the package can be made even thinner, which will allow an electronic device to be thinner as well. This benefit occurs because a height of the package 100 is not changed by adding the electrical interconnection bridge in this manner to the package. For example, two separate packages with two separate die would have the same height of the package 100, however, if electrical connections are then provided within an electronic device to couple the two separate packages, the height of an electronic device would be increased. Whereas, utilizing the package 100, the height of an electronic device is reduced because the package 100 still has the same height as the two separate packages and are already electrically coupled by the conductive material 108 in the opening 102, which removes the necessity of an electrical connection being provided within the electronic device to couple the two separate packages.

Another benefit of the package 100 is that a number of electrical connections that need to be provided in the electronic device are reduced as well, which will reduce the size and thickness of an electronic device. The number of electrical connections provided in an electronic device is reduced because the electrical connections between the semiconductor die 116, 128 within the package 100 are already formed. This benefit will also reduce a number of packages that need to be provided within an electronic device as well. This means that if a mounting area for packages within an electronic device is smaller due to an electronic device being articulable, e.g., bendable, less packages can be provided within the small mounting area but still allow the electronic device to perform all of the necessary or desired functions.

Another benefit of the package 100 is that the thin layers of conductive material 106, 110 lining the opening 102 increase the robustness of the electrical interconnection bridge between the two semiconductor die 116, 128 within the package 100. The robustness of the electrical interconnection bridge is increased because even before the conductive material 108 is placed within the opening 102, the thin layers of conductive material 106, 110 already electrically couple the two semiconductor die 116, 128 within the package 100. However, this benefit occurs when the opening 102 is lined when the molding compound is doped with a conductive material.

While these are some of the benefits of the package 100, there are and may be several other additional benefits when utilizing the package 100 or other alternative embodiments as disclosed in the present disclosure or within the scope of the present disclosure.

The benefits of the methods of producing the packages will now be discussed. For the sake of simplicity and brevity, the benefits will be discussed with respect to the embodiment in FIGS. 8A-8I. However, these benefits apply to each and every method of producing the disclosed package embodiments within the above present disclosure and within the scope of the above present disclosure. For example, the benefits also apply to the alternative method disclosed in FIGS. 9A-9L.

A benefit of the method in FIGS. 8A-8I is that any number of semiconductor die can be incorporated into a package with several electrical interconnection bridges to couple the semiconductor die within the package to each other. This allows for packages to be produced that can perform complex functions, and allows for semiconductor die within the package to communicate with each other quickly and easily.

Another benefit, which is similar to a benefit discuss above with the packages, is that the electrical interconnection bridges incorporated within the package reduce the number of external electrical connections that need to be provided separately in an electronic device. This reduction in the number of external electrical connections reduces the profile, e.g., size and thickness, of an electronic device.

Another benefit of the method in FIGS. 8A-8I is that by utilizing a molding compound doped with a conductive material, when forming or placing a conductive material with openings of packages to form electrical interconnection bridges, the reliability of the process can be increased. The reliability of the process is increased because thin layers of conductive material are formed that line the openings when a laser removes material from the package to form the openings. These thin layers of conductive material couple contacts of the semiconductor die to each other before the conductive material is placed in the openings. Also, when the conductive material is placed within the openings, the probability of a proper electrical connection being formed between the semiconductor die within the package is increased because the conductive material can be plated onto these thin layers of conductive material or the solder can more easily form an electrical connection between the semiconductor die.

Another benefit of the above method in FIGS. 8A-8I is that the steps can easily be rearranged to improve reliability of forming packages with electrical interconnection bridges. For example, the grinding wafer step 606 disclosed in FIG. 8D may be optional and may be removed altogether to save on cost.

Another benefit of the method in FIGS. 8A-8I is that the semiconductor die may be formed and incorporated into any number of packages with any number of profiles. For example, the packages may have a square profile, a rectangular profile, a circular profile, an oval profile, or any number of shape profiles so the package can be easily mounted within an electronic device.

While these are some of the benefits of the method in FIGS. 8A-8I, there are and may be several other additional benefits when utilizing the method in FIGS. 8A-8I or other alternative embodiments as disclosed in the present disclosure or within the scope of the present disclosure.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A device, comprising:
a substrate including a first portion and a second portion spaced apart from the first portion;
a first die coupled to the first portion of the substrate, the first die having a first contact on a first side and a second contact on a second side, the first side facing the substrate, the second side facing away from the substrate;
a second die coupled to the second portion of the substrate, the second die having a third contact on a third side and a fourth contact on a fourth side, the third side facing the substrate, the fourth side facing away from the substrate;
a molding compound on the second side of the first die, the fourth side of the second die, and the substrate;
an opening aligned with the second contact pad and the fourth contact pad, the opening extending into the molding compound; and
a first conductive material located within the opening, the first conductive material coupling the second contact pad of the first die to the fourth contact pad of the second die.

2. The device of claim 1, wherein the molding compound is doped with a conductive material.

3. The device of claim 1, wherein the opening includes a sidewall, the sidewall being covered in a thin layer of a second conductive material.

4. The device of claim 3, wherein the thin layer of the second conductive material is coupled to the second contact pad and the fourth contact pad.

5. The device of claim 1, wherein a thin layer of a second conductive material located between the second contact and the fourth contact.

6. The device of claim 1, wherein the first conductive material is a solder material.

7. The device of claim 1, wherein the first conductive material is a conductive plating material.

8. The device of claim 1, wherein the substrate includes a passivation layer, a redistribution layer, a first contact pad, and a second contact pad.

9. The device of claim 1, further comprising:
a first passivation layer on the second side of the first die;
a second passivation layer on the fourth side of the second die;
a first conductive layer on the first passivation layer, the first conductive layer coupled to the second contact; and
a second conductive layer on the second passivation layer, the second conductive layer coupled to the fourth contact.

10. A device, comprising:
a substrate including a first surface, a second surface facing away from the first surface, and a plurality of first contacts on the first surface;
a first package coupled to the second surface of the substrate, the first package including a first die, a first molding compound on the first die, and a second contact;
a second package coupled to the second surface of the substrate and spaced apart from the first package, the second package including a second die, the first molding compound on the second die, and a third contact;
an opening located between the first package and the second package, the opening aligned with the second contact and the third contact;
a second molding compound on the first molding compound, the second molding compound located between the second contact and the third contact; and
a conductive material located within the opening.

11. The device of claim 10, wherein the conductive material is an electrical interconnection bridge.

12. The device of claim 10, wherein a thin layer of conductive material is located between the second contact and the third contact.

13. The device of claim 10, further comprising:
a first passivation layer on the first die;
a second passivation layer on the second die;
a first conductive layer on the first passivation layer, the first conductive layer coupled to the second contact; and
a second conductive layer on the second passivation layer, the second conductive layer coupled to the third contact.

14. The device of claim 10, wherein the conductive material within the opening is coupled to the second contact and the third contact.

15. A method, comprising:
coupling a first die to a first substrate;
coupling a second die to a second substrate;
forming a molding compound on the first die and the second die, the molding compound physically coupling the first die to the second die;
forming an opening in the molding compound between the first die and the second die, the opening exposing a first contact of the first die and a second contact of the second die; and
forming a first conductive material within the opening, the first conductive material electrically coupling the first contact of the first die to the second contact of the second die.

16. The method of claim 15, wherein the molding compound is doped with a second conductive material.

17. The method of claim 16, wherein forming the opening in the molding compound between the first die and the second die further includes laser direct structuring the molding compound.

18. The method of claim 17, wherein laser direct structuring the molding compound forming the opening further includes forming a thin layer of the second conductive material on the molding compound.

19. The method of claim 15, wherein forming the first conductive material within the opening further includes positioning a solder material within the opening.

20. The method of claim 15, wherein forming the first conductive material within the opening further includes electroless plating the first contact and the second contact.

* * * * *

UNITED STATES PATENT AND TRADEMARK OFFICE
CERTIFICATE OF CORRECTION

PATENT NO. : 11,270,946 B2
APPLICATION NO. : 16/987002
DATED : March 8, 2022
INVENTOR(S) : Yong Chen Page 1 of 1

It is certified that error appears in the above-identified patent and that said Letters Patent is hereby corrected as shown below:

On the Title Page

<u>Second column, item (56), under OTHER PUBLICATIONS, Line 1:</u>
"EMTB" should read: --EMIB--.

<u>Second column, item (56), under OTHER PUBLICATIONS, Line 4:</u>
"20±9" should read: --2019--.

Signed and Sealed this
Eighteenth Day of October, 2022

Katherine Kelly Vidal
*Director of the United States Patent and Trademark Office*